(12) United States Patent
Reiter et al.

(10) Patent No.: US 11,394,378 B2
(45) Date of Patent: Jul. 19, 2022

(54) POWER SWITCH WITH AN INTEGRATED TEMPERATURE AND CURRENT SENSE CIRCUIT

(71) Applicant: Infineon Technologies AG, Neubiberg (DE)

(72) Inventors: Tomas Manuel Reiter, Munich (DE); Georg Schinner, Munich (DE); Frank Wolter, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 826 days.

(21) Appl. No.: 15/911,939

(22) Filed: Mar. 5, 2018

(65) Prior Publication Data

US 2019/0273488 A1 Sep. 5, 2019

(51) Int. Cl.
| | |
|---|---|
| *H03K 17/081* | (2006.01) |
| *H02H 9/02* | (2006.01) |
| *H02H 1/00* | (2006.01) |
| *H01L 27/02* | (2006.01) |
| *G01K 7/01* | (2006.01) |
| *G01R 19/00* | (2006.01) |
| *H03K 17/08* | (2006.01) |

(52) U.S. Cl.
CPC ......... *H03K 17/08116* (2013.01); *G01K 7/01* (2013.01); *G01K 7/015* (2013.01); *G01R 19/00* (2013.01); *H01L 27/0255* (2013.01); *H02H 1/0007* (2013.01); *H02H 9/02* (2013.01); *H03K 17/08104* (2013.01); *H03K 2017/0806* (2013.01)

(58) Field of Classification Search
CPC ....... H03K 17/08116; H03K 17/08104; H03K 2017/0806; H03K 17/0828; H03K 17/0812; H03K 17/14; H03K 17/567; G01K 7/015; G01K 7/01; H02H 9/02; H02H 1/0007; H02H 7/222; H02H 3/08; H02H 5/044; H02H 5/047; H02H 5/048; H01L 27/0255; H01L 27/0248; G01R 19/00
USPC .......................... 374/178, 141; 361/103, 106
See application file for complete search history.

(56) References Cited

U.S. PATENT DOCUMENTS

2016/0013639 A1* 1/2016 Willkofer ........... H03K 17/0828
361/56
2019/0131964 A1* 5/2019 Bryant ................... H03K 17/74

* cited by examiner

*Primary Examiner* — Lisa M Caputo
*Assistant Examiner* — Janice M Soto
(74) *Attorney, Agent, or Firm* — Slater Matsil, LLP

(57) ABSTRACT

An integrated circuit comprises a power switch comprising a current path and a current sense node; and a temperature sense circuit internally coupled between the current path and the current sense node.

11 Claims, 12 Drawing Sheets

US 11,394,378 B2

POWER SWITCH WITH AN INTEGRATED TEMPERATURE AND CURRENT SENSE CIRCUIT

TECHNICAL FIELD

The present invention relates generally to a system and method for a power switch with an integrated temperature and current sense circuit.

BACKGROUND

A power semiconductor device is a semiconductor device that may be used as a switch or rectifier for power electronics. Power semiconductor devices, which may be referred to as power devices, are often formed as integrated circuits ("ICs") to produce power ICs. The applications of power devices are numerous and advances in technology have further increased the number of possible applications, especially in the field of power ICs.

Power devices are most commonly implemented as power switches in order to operate in either a conduction mode (ON) or a non-conduction mode (OFF). Often power devices are used to block a large voltage from being supplied to a load or to supply the large voltage across the load.

Some common power devices are the power diode, thyristor, power metal-oxide-semiconductor field effect transistor ("MOSFET"), and insulated gate bipolar transistor ("IGBT").

Due to the increased current or voltage generally associated with power devices, a power device is often structurally designed in order to accommodate the higher current density, higher power dissipation, or higher breakdown voltage. For example, power devices are often built using a vertical structure and have a current rating proportional to the device's area and a voltage blocking capability related to the height or thickness of the device in the substrate. With vertical power devices, as compared to lateral non-power devices, one of the device terminals is located on the bottom of the semiconductor die.

Power devices sometimes include current and temperature sensing mechanisms to monitor overcurrent or over temperature operating conditions. The output of such sensing mechanisms can be passed to other control and protection circuits for controlling the operation of one or more power devices. Such control and protection circuits operate to disable power devices when an overcurrent or over temperature operating condition is detected.

SUMMARY

In accordance with an embodiment, an integrated circuit comprises a power switch comprising a current path and a current sense node, and a temperature sense circuit internally coupled between the current path and the current sense node.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
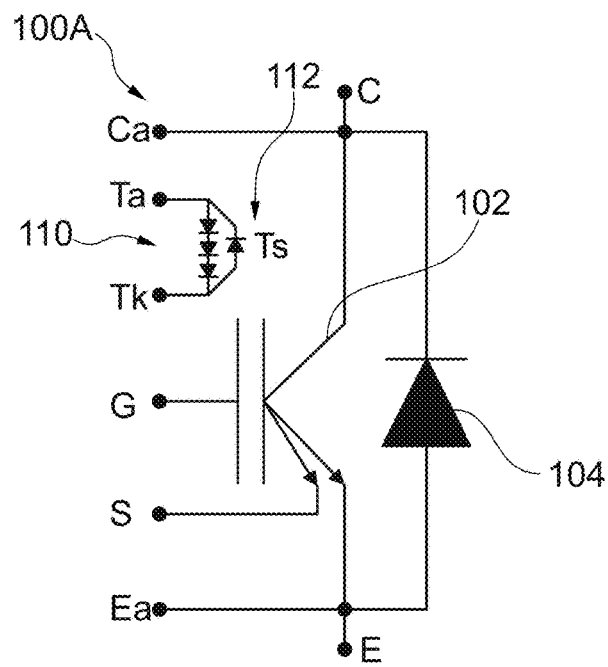
FIG. 1A is a schematic of a power switch (in this example drawn as IGBT with antiparallel diode) with a current sense and a temperature sense circuit according to an embodiment.

FIG. 1A shows a schematic of an integrated circuit 100A according to an embodiment. The integrated circuit 100A includes an IGBT 102 having a collector coupled to a collector node C and an optional auxiliary collector node Ca, a gate coupled to a gate node G, and an emitter coupled to an emitter node E and an optional auxiliary emitter node Ea. The auxiliary collector and emitter nodes Ca, Ea may be dictated, for example, by the form factor of a package used for the integrated circuit 100A. The auxiliary collector node Ca and auxiliary emitter node Ea are typically used in applications where the corresponding collector and emitter power switch voltage potentials (at collector node C and emitter node E) have to be measured precisely and/or the power switch has to be switched quickly, although the power chip (integrated circuit) is implemented in an environment with non-negligible stray inductances in the load current paths (e.g. several nH stray inductance). Integrated circuit 100A also provides a current mirroring function, wherein a sense emitter provides a small portion of an emitter current of the IGBT 102 at a sense emitter node S. Typically, the ratio of a sense emitter current (provided by a small number of sense emitter cells) to the emitter current (provided by a relatively large number of emitter cells) can be about ¹⁄₁₀₀₀, but the ratio can vary for a particular application. An anti-parallel freewheeling power diode 104 is also included in integrated circuit 100A and is coupled between the collector node C and the emitter node E. As also shown in FIG. 1A, the integrated circuit 100A further comprises an on-chip temperature sense circuit Ts comprising a diode stack 110 and an anti-parallel diode 112 coupled between nodes Ta and Tk. In FIG. 1A, three diodes are shown in diode stack no, but any number can be used. The use of the several diodes in series is done to assure greater accuracy in measuring the voltage across the diodes, which in turn assures greater accuracy in determining the temperature of the integrated circuit 100A. The voltage of the diode stack 110 can be converted to temperature according to equations that are known in the art. The anti-parallel diode 112 is used to clamp a voltage at emitter node E of IGBT 102, as will be described in further detail below.

The detailed operation of temperature and current sense circuits of integrated circuit 100A is described in further detail below. The electrical connections of nodes Ta and Tk of the temperature sense circuit Ts can be configured in various ways according to embodiments.

Figure 1B:
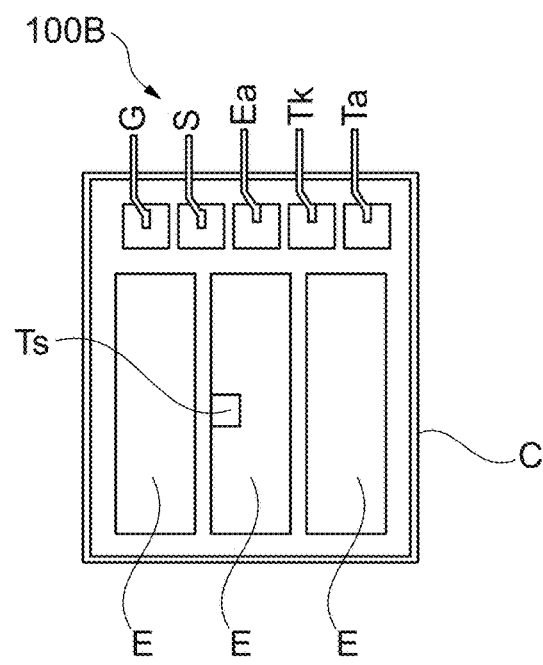
FIG. 1B is a plan view of a power switch layout for the power switch of FIG. 1A.

An example IGBT integrated circuit layout 100B of the IGBT integrated circuit 100A is shown in FIG. 1B. The gate node G, the sense emitter node S, the auxiliary emitter node Ea, and the temperature sense circuit nodes Tk and Ta are shown as bonding pads arranged in a line on a top surface of the IGBT integrated circuit layout 100B. The emitter node E is shown as being configured as three power stripes on the top surface of the IGBT integrated circuit layout 100B, and the temperature sense circuit Ts occupies a small portion of a central one of the three power stripes of the emitter node E shown in FIG. 1B. Since IGBT 102 is a vertical device, the collector node C occupies the entire bottom surface of the layout 100B, with only a small edge portion being visible from the top surface of IGBT integrated circuit layout 100B. IGBT integrated circuit layout 100B also corresponds to a physical embodiment of integrated circuit 100A, wherein integrated circuit 100A comprises a semiconductor body having a top surface and a bottom surface, wherein the top surface of IGBT integrated circuit layout 100B corresponds to the actual top surface of integrated circuit 100A and the bottom surface of IGBT integrated circuit layout 100B corresponds to the actual bottom surface of integrated circuit 100A. The integrated circuit and layout embodiment described above, as well as other integrated circuit and layout embodiments described herein therefore correspond to an equivalent physical embodiment of an integrated circuit having a semiconductor body with a top surface and a bottom surface.

The embodiment of integrated circuit 100A shown in FIG. 1A has maximum flexibility in the interconnection of the circuit nodes. Integrated circuit layout 100B has five signal pads as previously described, which leads to a high connection effort and a low package utilization. ElectroStatic Discharge ("ESD") robustness is low as the temperature sense diodes 110 and 112 have a floating potential as previously described. ESD robustness of the sense emitter node S is low, especially when a low number of current sense IGBT cells are implemented. However, a high number of current sense IGBT cells to improve ESD robustness leads to a lower active area utilization. The current mirror IGBT cells ideally have low external inductance since they are typically connected to a sensing resistor or equivalent circuit. If the sense emitter node S has high stray inductance, IGBT destruction from corresponding high voltages can result during transient switching operations. Such an event can be generally described as an Electric Over Stress (EOS) event.

Figure 1C:
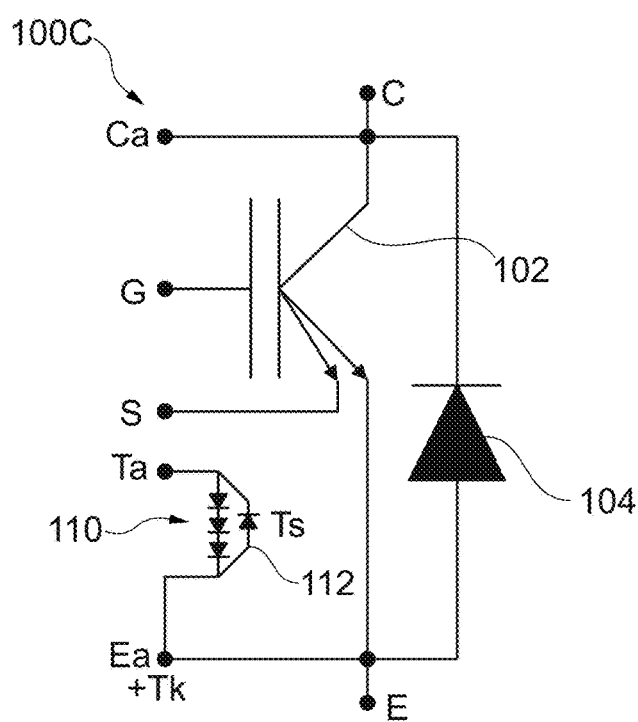
FIG. 1C is a schematic of a power switch and a temperature sense circuit according to an embodiment.

Due to the ESD weakness of the temperature sense diodes 110 (note again that both nodes Ta and Tk are floating in the integrated circuit 100A of FIG. 1A), one branch of the temperature sense diodes 110 can be coupled to the emitter potential of the IGBT 102. IGBT integrated circuit 100C is thus shown as having coupled Tk and Ea nodes in an embodiment. The ESD robustness of the embodiment of IGBT integrated circuit 100C shown in FIG. 1C is thus improved compared to the IGBT integrated circuit 100A shown in FIG. 1A. The Tk node of the temperature sense circuit Ts does not have a floating potential in integrated circuit 100C.

Figure 1D:
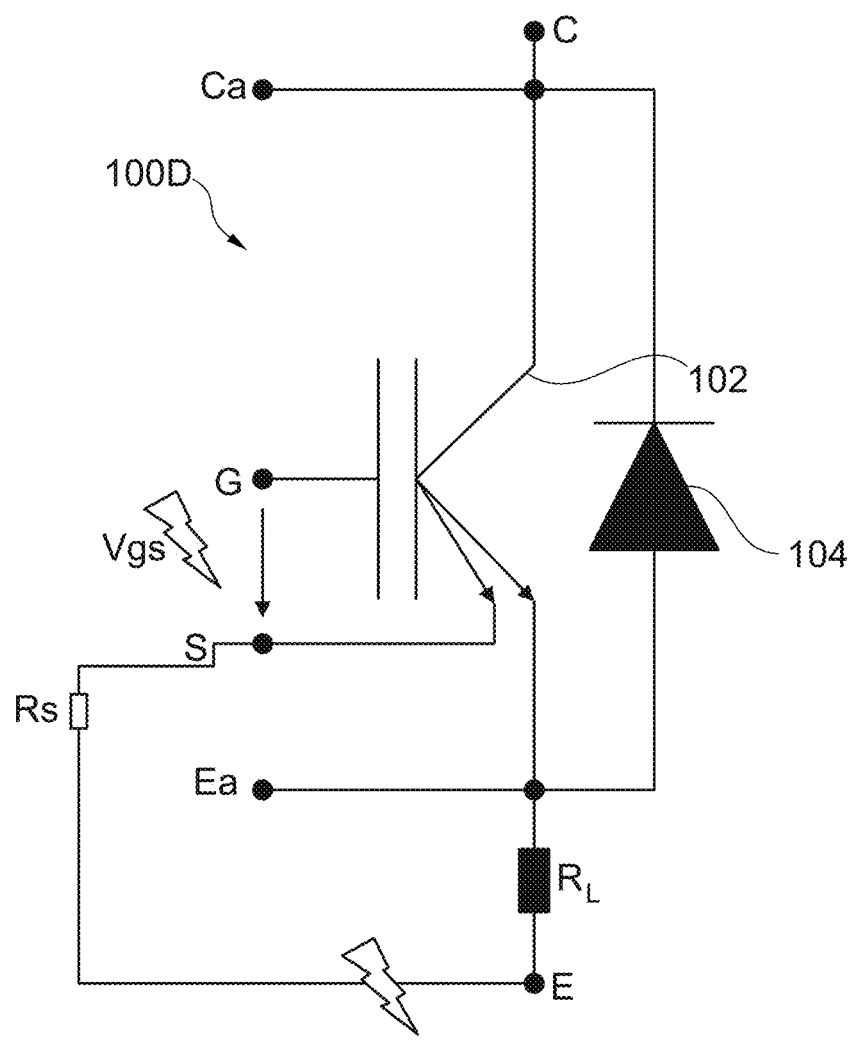
FIG. 1D is a schematic of a power switch with higher inductance between auxiliary and load emitter showing an Electric Over Stress ("EOS") event in transient load switching events.

The stray inductance problem described above is shown in further detail in integrated circuit 100D of FIG. 1D. The IGBT 102 and anti-parallel diode 104 are depicted in FIG. 1D as well as an external load resistor Rl coupled between the emitter and auxiliary emitter nodes E and Ea, as well as an external sense resistor Rs coupled between the sense emitter and emitter nodes S and E. The temperature sense circuit is not shown in FIG. 1D. A problem in an application of integrated circuit 100D is that the current mirror cells (current sense IGBT cells) can be damaged by high voltage transients. In FIG. 1D, the sense emitter node S is connected to the load path with higher stray inductance through sense resistor Rs. During switching, high voltage transients and can lead to the gate voltage exceeding the maximum allowed gate-to-source voltage of the current sense IGBT cells (Vgs), which is generally described herein as an Electric Over Stress (EOS) event.

Figure 1E:
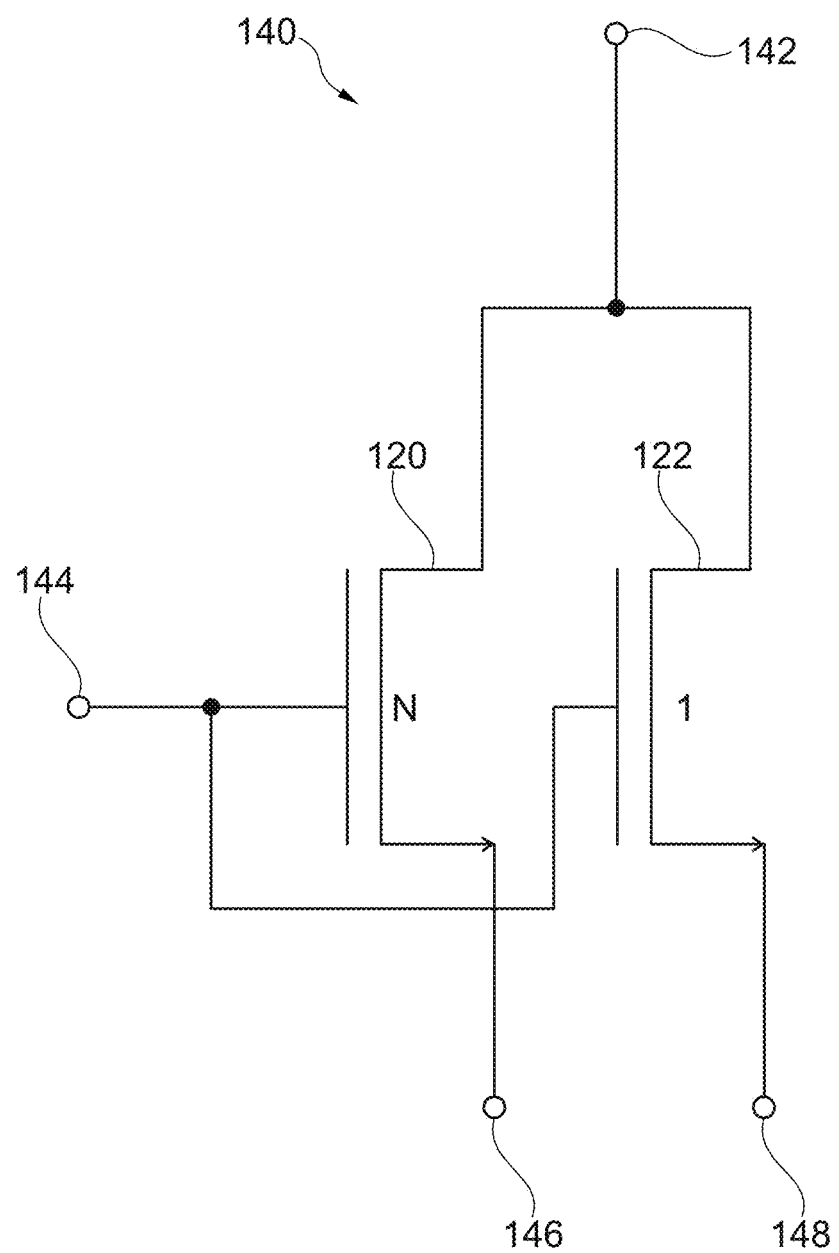
FIG. 1E is a schematic of a power switch (in this example drawn using MOSFET transistors), but without the previously described accompanying diode and sense circuits according to an embodiment.

While an IGBT 102 is shown in the integrated circuit 100A of FIG. 1A, a power MOSFET transistor or transistors can be substituted as well, including a current path between a drain node and one of at least two source nodes, wherein the current flow through the current path is controlled by a gate node. One of the at least two source nodes can be used to provide the current mirroring function in a similar manner as described above to provide a small portion of current flow, while the other one of the at least two source nodes is configured to provide a major portion of the current flow as a load current to a load in an on-state of the power MOSFET transistor. Referring now to FIG. 1E, an example MOSFET power switch 140 is shown including a first MOSFET transistor 120 having a device area of "N" area units and a second MOSFET transistor 122 having a device area of "1" area unit. The drains of MOSFET transistors 120 and 122 are coupled together at a common drain node 142, and the gates of MOSFET transistors 120 and 122 are coupled together at a common gate node 144. Note that a first source node 146 provides the majority of the current flow in the power switch 140 as, for example, a load current. A second source node 148 provides a small portion of the current flow in the power switch 140 as, for example, a sense current. The sense current and the load current are ratioed according to the respective device areas. The sense and diode circuits are not depicted in FIG. 1E, but, if used, would be substantially the same as previously described with reference to FIG. 1A. Similar substitutions of IGBT and MOSFET power switches can be made for embodiments described below, wherein only an IGBT implementation may be shown.

Further power switch embodiments are discussed below that address the above performance and utilization issues.

Figure 2A:
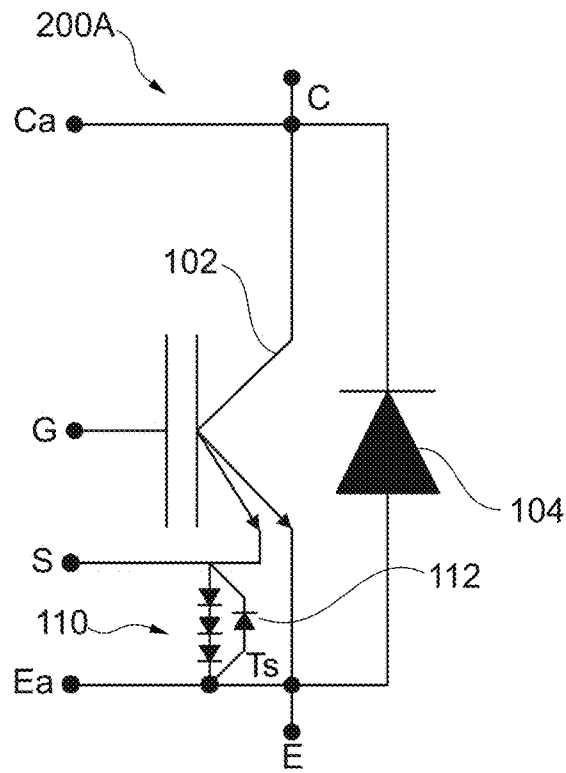
FIG. 2A is a schematic of a power switch and a temperature sense circuit according to an embodiment.

An embodiment of a power switch realized as an integrated circuit 200A is shown in FIG. 2A. The IGBT 102 and the freewheeling diode 104, as well as the corresponding nodes are substantially the same as previously described. However, the on-chip temperature sense diodes 110 and 112 of temperature sense circuit Ts are internally connected between the sense emitter node S and the auxiliary emitter node Ea or emitter node E. The sense emitter cells of IGBT 102 and temperature sense diodes 110 and 112 are designed in such way that the temperature sense diodes can carry all of the current of the sense emitter cells in case the sense emitter node S is externally unconnected. The ability to carry all of the current at sense emitter node S is achieved either by a strong enough (large enough area) of temperature sense diodes 110 and 112 or by a low number (to reduce current flow) of sense emitter cells in IGBT 102, or both. The benefits and operation of the integrated circuit 200A shown in FIG. 2A and related embodiments are discussed in further detail below.

Figure 2B:
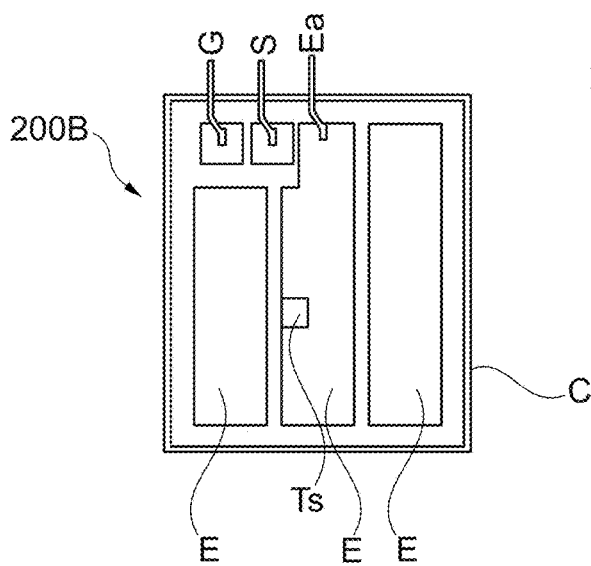
FIGS. 2B and 2C are plan views of power switch layouts for the power switch of FIG. 2A.
Figure 2C:
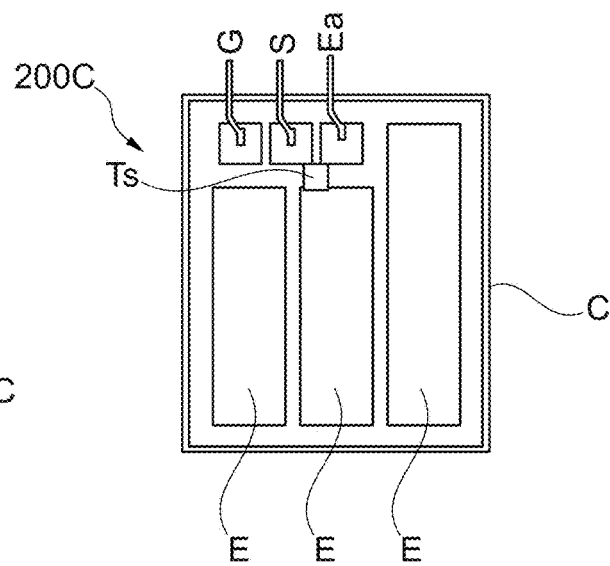

Embodiment layouts 200B and 200C of integrated circuit 200A are shown in FIGS. 2B and 2C. It is not mandatory to have a physically separate Ea pad as is shown in layout 200B of FIG. 2B. Layout 200B includes bonding pads only for the gate node G and sense emitter node S. The bonding pad of the auxiliary emitter node Ea is merged into the center one of the three emitter power stripes E as shown. As in the embodiment of FIG. 1B, the temperature sensing circuit Ts occupies a portion of one of the emitter power stripes E. The collector node C is on the bottom side of the integrated circuit, and a small edge portion of the collector node C is shown in FIG. 2B.

FIG. 2C shows an alternative layout 200C for integrated circuit 200A that uses a dedicated bonding pad at auxiliary emitter node Ea. The bonding pads for gate node G and sense emitter node S, as well as the emitter power stripes of emitter node E, and the collector node C are substantially the same as in layout 200B shown in FIG. 2B.

The temperature sense circuit Ts can be placed in the center of the layout 200B, as is shown in FIG. 2B for precise integrated circuit temperature measurements, or on the side of the emitter power stripes of emitter node E for minimizing the loss of active area of the IGBT load area as shown in the layout 200C of FIG. 2C. While two locations for temperature sense circuit Ts are shown in FIGS. 2B and 2C, other integrated circuit locations can be used as well. It is also suitable to place the temperature sense diodes distributed over the chip area in order to get an averaged signal of, e.g., the chip center and the chip corner.

The layouts 200B and 200C shown in FIGS. 2B and 2C use a low number of signal pads (one pad for gate node G, one pad for sense emitter node S, and an optional pad for auxiliary emitter node Ea), which leads to minimum package effort for accessing the bond pads and to high active area utilization. The layouts 200B and 200C shown in FIGS. 2B and 2C have the highest ESD robustness as no areas of the integrated circuit are floating. Also the small current mirror function provided by IGBT 102 is protected via the temperature sense diodes 110 and 112. The layouts 200B and 200C also have high EOS robustness in case high stray inductance loops are externally connected to a sense resistor external component (Rs) described in further detail below.

Figure 3:
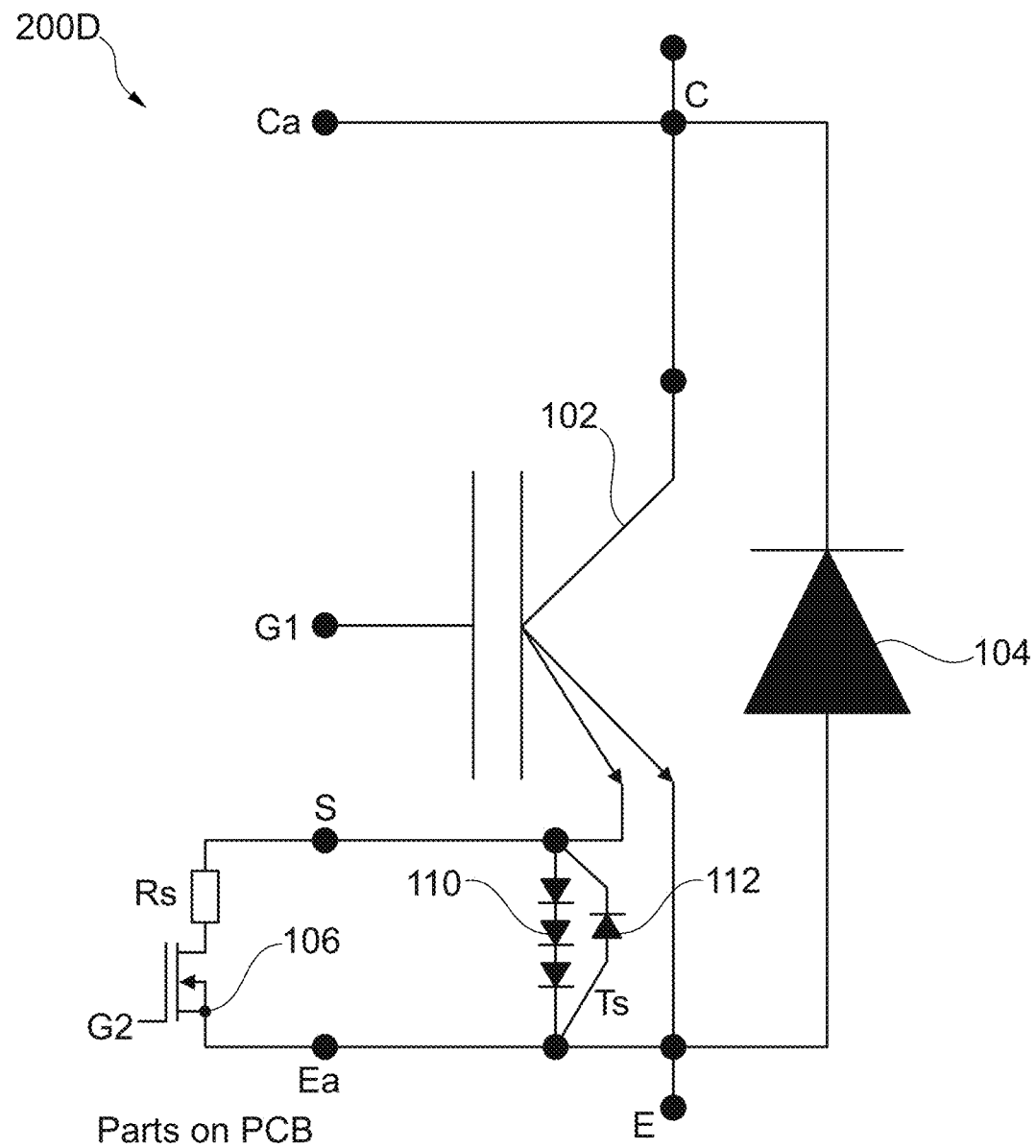
FIGS. 3 and 4 are schematic diagrams of the power switch shown in FIG. 2A including additional circuitry resident on a printed circuit board.

FIG. 3 shows a power switch realized as an integrated circuit 200D including additional external circuitry needed to complete the temperature sensing and current sensing functionality. Integrated circuit 200D is coupled to an external sense resistor Rs and an external transistor 106 (having a smaller size than a size of a power transistor) resident on a printed circuit board (PCB) that are not integrated into integrated circuit 200D, in an embodiment. Sense resistor Rs and external transistor 106 are coupled between sense emitter node S and auxiliary emitter node Ea, in an embodiment. A gate node G1 of IGBT 102 is coupled to a gate node G2 of transistor 106, in an embodiment. Transistor 106 is shown as a MOSFET in an embodiment, but other types of transistors can be used.

In operation, when the coupled gate nodes G1 and G2 are both switched high, the current of IGBT 102 can be sensed (current sensing method) by measuring the voltage across sense resistor Rs at the sense emitter node S and auxiliary emitter node Ea, dividing by the resistance of resistor Rs, and multiplying by the ratio of the emitter size to the sense emitter size. When the coupled gate nodes G1 and G2 are both switched low, the temperature of IGBT 102 can be sensed (temperature sensing method) by injecting a current into the sense emitter node S and auxiliary emitter node Ea, measuring the developed voltage at the sense emitter node S and the auxiliary emitter node Ea, dividing by the number of diodes used, and interpolating the voltage to a diode temperature using diode current equations known to those in the art.

As described above, the transistor 106 can be controlled with the same gate voltage as the load IGBT 102. Then automatically, when IGBT 102 is turned on the integrated circuit 200D is in the current sensing mode. An advantage of integrated circuit 200D is that if stray inductance of the sense emitter node S results in high voltage overshoots, these overshoots will be clamped by the temperature sense diodes 110 and 112 thus protecting the IGBT 102 from EOS events and destruction. As described above, when the IGBT 102 is turned off the sensing resistor Rs is disconnected and the temperature sense diodes 110 and 112 can be used for temperature sensing.

A general advantage of integrated circuits 200A and 200D shown in FIG. 2A and FIG. 3 is that the IGBT 102 is connected/tested with only external pads associated with the gate node G, collector node C, and emitter node E, even though all other pads (pins) are externally floating. However, even though the pads of sense emitter node S, auxiliary collector node Ca, and auxiliary emitter node Ea may be floating, no critical potentials will occur due to these open pads because of the internal circuitry and corresponding electrical connections as previously described. In contrast, in integrated circuit 100A of FIG. 1A, at least some of these pads must be connected externally in order to prevent floating nodes and to overcome the ESD as well as EOS problems previously described.

Figure 4:
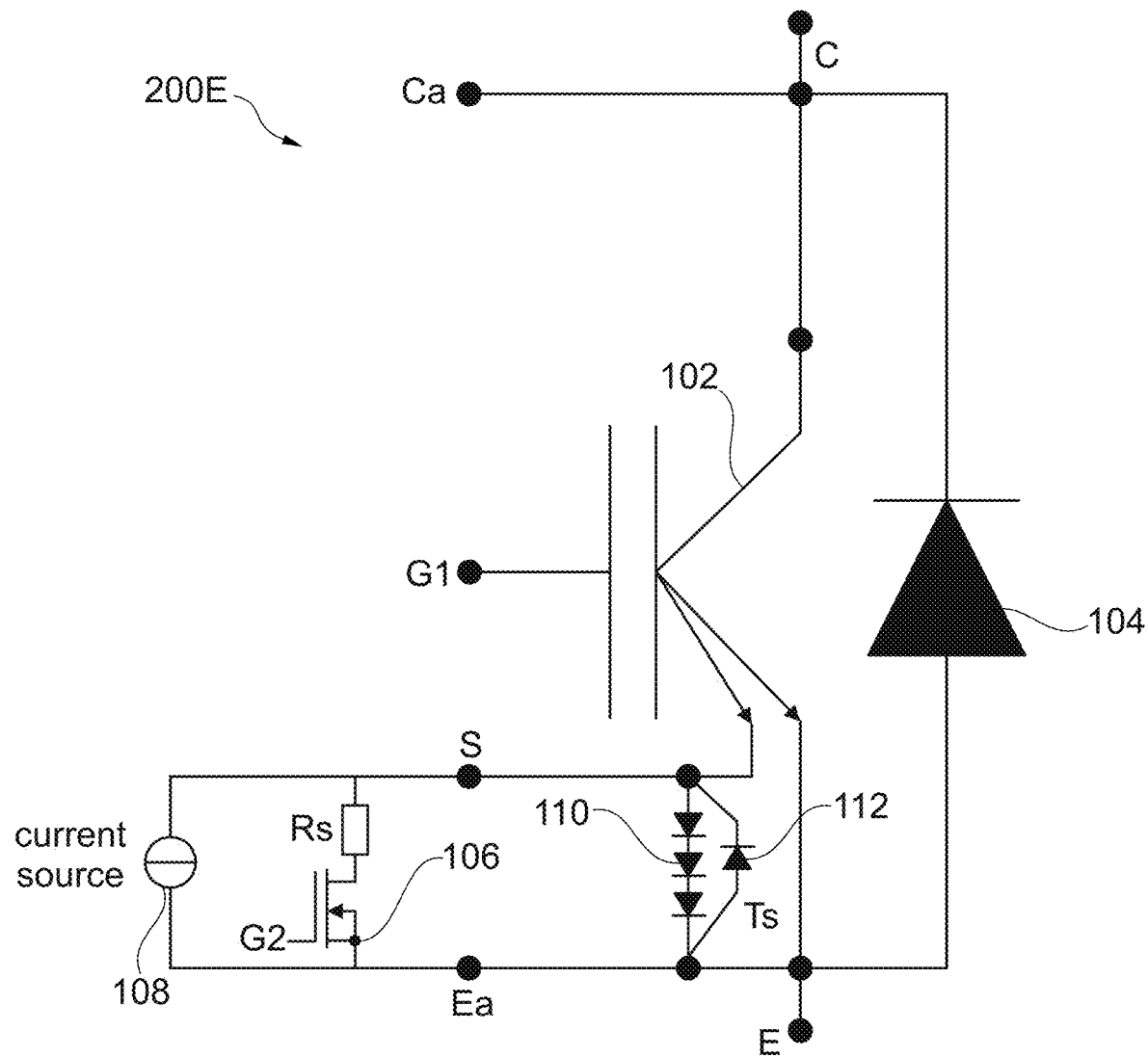

FIG. 4 shows an integrated circuit 200E and additional external circuitry configured for the temperature sensing mode. A current source 108 injects current to the temperature sensing diodes 110 and measures via the pn junction drop the temperature of the IGBT 102. In the temperature sensing mode, the gate nodes are OFF. The description of the integrated circuit 200E is similar to that of the description of the integrated circuit 200D previously described with respect to FIG. 3, except for the addition of the current source 108 that is also an external component and not integrated together with integrated circuit 200E.

Additionally, related to the temperature sensing mode, a diagnosis of sense resistor Rs and the current source 108 can also be performed, if desired. The diagnosis is performed in a no load operating mode or in a freewheeling operating mode where the antiparallel diode 104 conducts current and no current flows through the IGBT 102. The IGBT 102 can be turned-on in the diagnosis mode as long as there is no load current. The high gate value also turns on transistor 106 and also connects the sensing resistor Rs between the sense emitter node S and the auxiliary emitter node Ea. Due to the R=U/I ohmic law it is now possible with a known sense resistor value (R) and a measured voltage drop (U) to check the value of the small signal current source (I). Or, alternatively, when the current source has a known status the sense resistor value Rs can be checked. A diagnosis mode is thus possible during application time for current source 108 and/or sense resistor Rs, which can show also degradation, drift failures over lifetime and can lead to wrong signals.

In operation, the current source diagnosis proceeds according to the following steps:

1. During operation, wait for a no load, no switching operational phase (in the alternative, a freewheeling phase during switching). In this operation phase, the current emitter does not inject current into temperature sense circuit Ts or sensing resistor Rs.

2. Enable current source 108 and the sensing resistor Rs by turning on the auxiliary gate G2 of transistor 106.

3. Measure the voltage drop across sense emitter node S and auxiliary emitter node Ea.

4.1. With a known value of sensing resistor Rs (including the parasitic MOSFET resistance of transistor 106), the current source injects a current I=Voltage_S_Ea/Rs, wherein the term Voltage_S_Ea represents the voltage across the sense emitter node S and auxiliary emitter node Ea. This measured current value can be compared with the set point of the current source.

4.2. With a known current source current, the value of sensing resistor Rs (including the parasitic MOSFET resistance of transistor 106) can be calculated as Rs=Voltage_S_Ea/Isource. This resistance value can be compared with the implemented resistance value and thus the sense resistor Rs can be periodically checked for drifts over the lifetime of the integrated circuit 200E and/or degradation or damage of the sensing resistor Rs.

The inverter system (not shown) utilizing the integrated circuit and supporting circuitry of described embodiments will be more robust against ESD events and also for electric overstress (EOS). Integrated circuit 100D of FIG. 1D showed an embodiment where the current sense is connected to a relative high stray inductance in the load path. The stray high inductance can lead to IGBT failures as was previously described.

Figure 5:
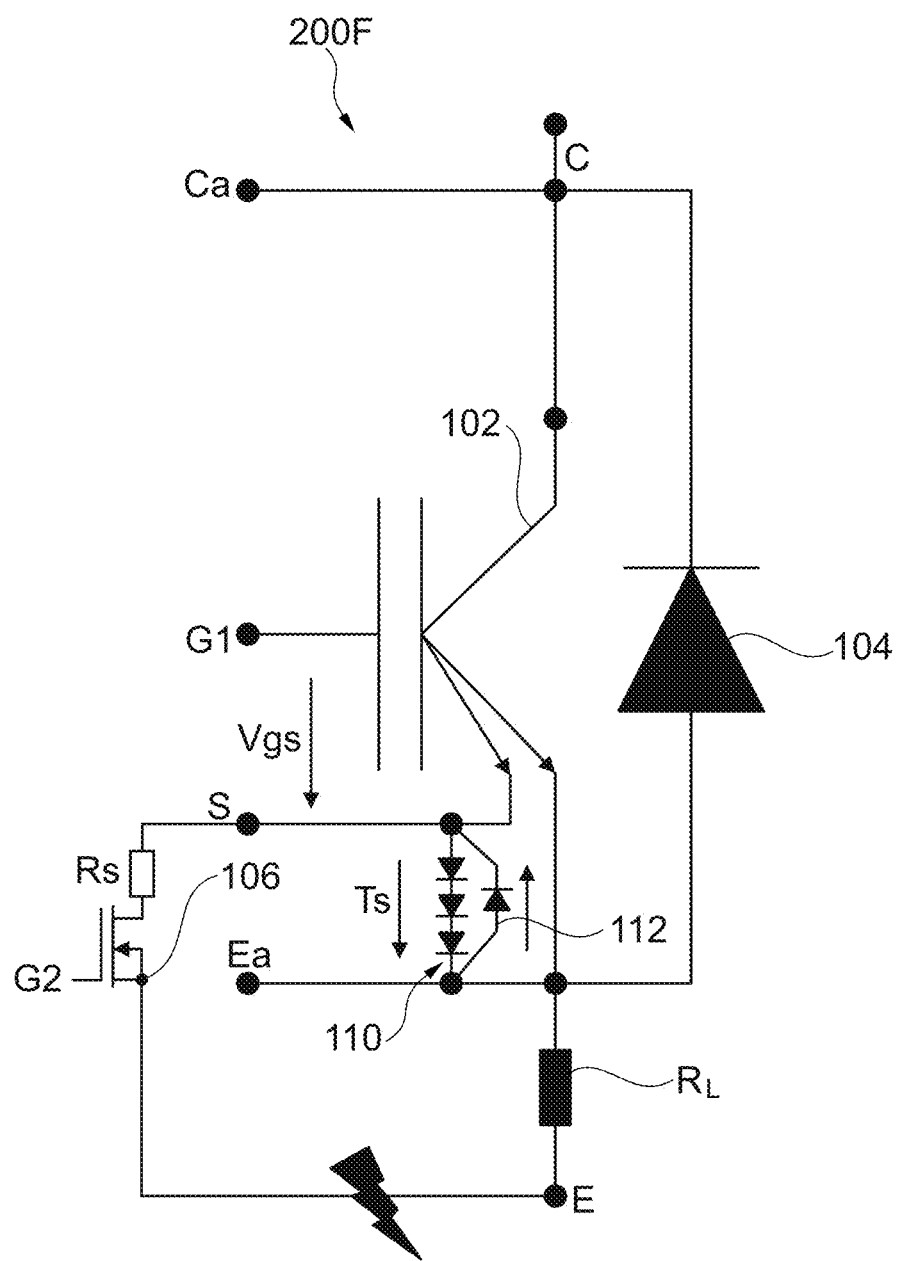
FIG. 5 is a schematic diagram of the power switch shown in FIG. 3 further illustrating transient switching operating conditions including parasitic inductances in the load emitter path.

The integrated circuit 200F and supporting circuitry shown in FIG. 5 protects the integrated circuit from Vgs overvoltages in the case of high inductance connections. While circuit 200F has been previously described with respect to circuit 200D of FIG. 3, it is reproduced here with additional directional arrows to further illustrate the EOS robustness improvement for high inductance connection applications.

With the circuit 200F shown in FIG. 5, the internal connected temperature sense diodes 110 and 112 in the temperature sensing circuit Ts connects the sense emitter node S to the auxiliary emitter node Ea. In the case of transient higher voltages on the emitter node E, the temperature sense diodes 110 and 112 will clamp or limit the overvoltage and thus protect the IGBT 102 from an electric overstress event ("EOS"). When a customer has open sensor pads in an application, the same principle will protect the IGBT from overvoltage and makes the integrated circuit more robust. Thus, FIG. 5 depicts a protected value of Vgs between the gate node G1 and sense emitter node S due the voltage clamping action of diodes 110 in a first direction, and the voltage clamping action of diode 112 is a second direction.

Figure 6A:
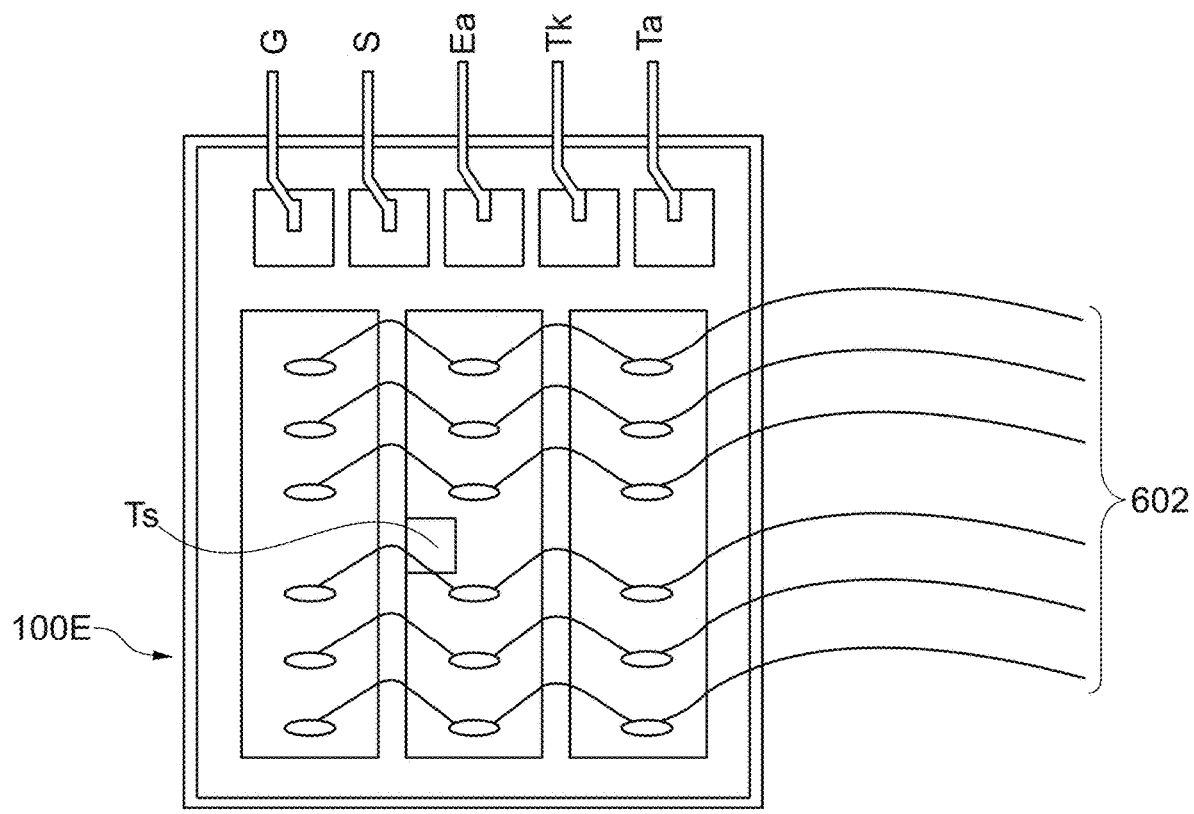
FIGS. 6A, 6B, and 6C are plan views of power switch layouts for the power switches shown in FIGS. 1A and 2A further illustrating top-side emitter bonding pad placement.
Figure 6B:
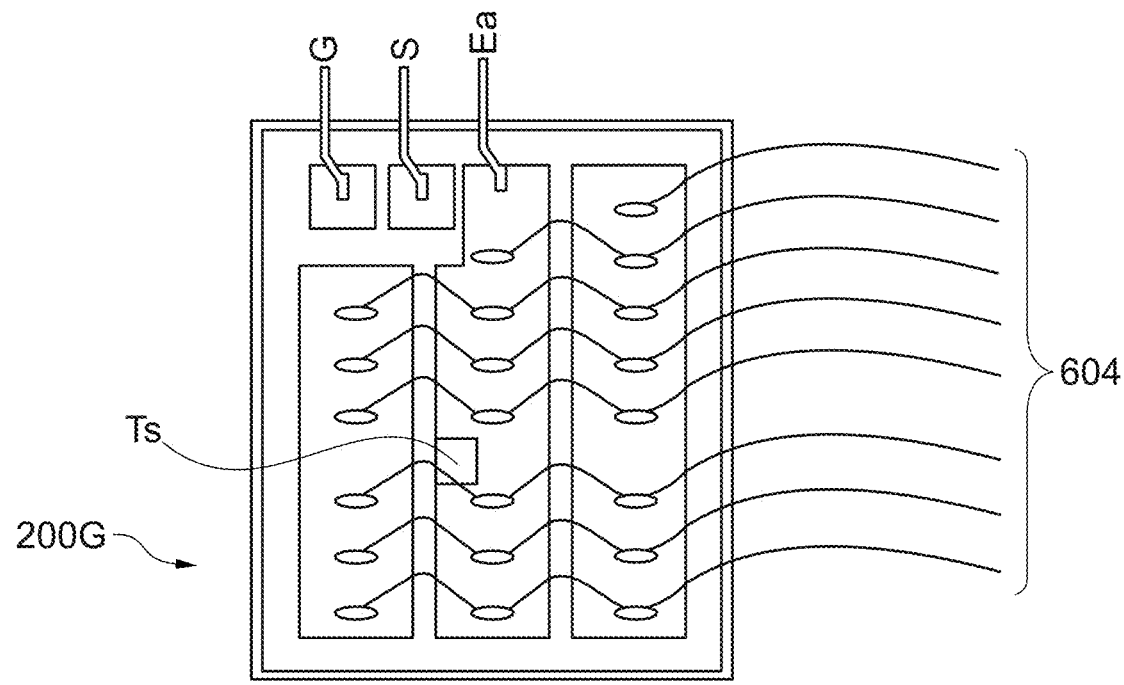
Figure 6C:
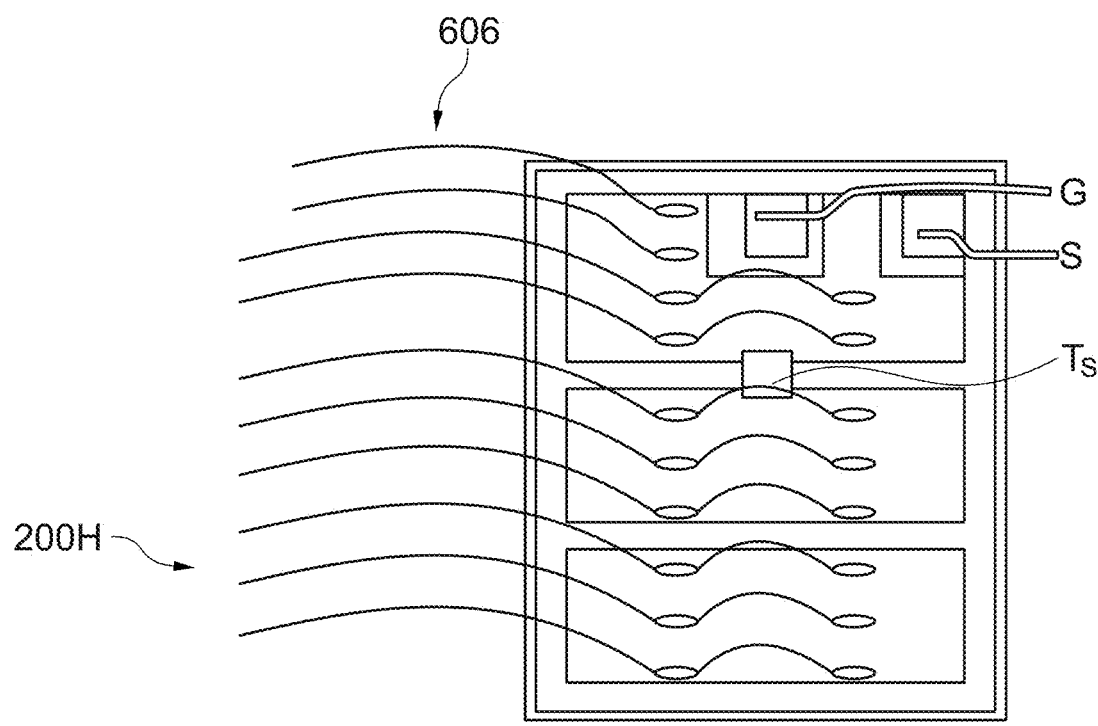

FIGS. 6A, 6B, and 6C further illustrate integrated circuit area utilization according to embodiments. Particularly, the utilization of the top-side emitter bonding wires are shown. In FIG. 6A, a layout 100E of an IGBT circuit including a temperature sensing circuit Ts is shown wherein separate gate node G, sense emitter node S, auxiliary emitter node Ea, and temperature sensing circuit nodes Tk and Ta are brought out to individual bonding pads. In this embodiment, there are eighteen bonding locations available coupled to six emitter bonding wires 602. In FIG. 6B, a layout 200G of an IGBT circuit including a temperature sensing circuit Ts is shown wherein only a separate gate node G, a sense emitter node S, and an auxiliary emitter node Ea are brought out to individual bonding pads. In this embodiment, note that there are an additional three bonding locations available with an additional two emitter bonding wires. In total, there are eighteen bonding locations (in layout 100E) with eight emitter bonding wires 604. In FIG. 6C, a layout 200H of an IGBT circuit including a temperature sensing circuit Ts is shown wherein only a separate gate G and a sense emitter node S are brought out to individual bonding pads. In this embodiment, note that there are an additional six bonding locations available in additional to the eighteen bonding locations (in layout 100E) for coupling to bonding wires 606. Thus, FIGS. 6B and 6C illustrate in additional detail that there is greater integrated circuit area available for power distribution when fewer bonding pads are used according to the embodiments described herein.

Figure 7:
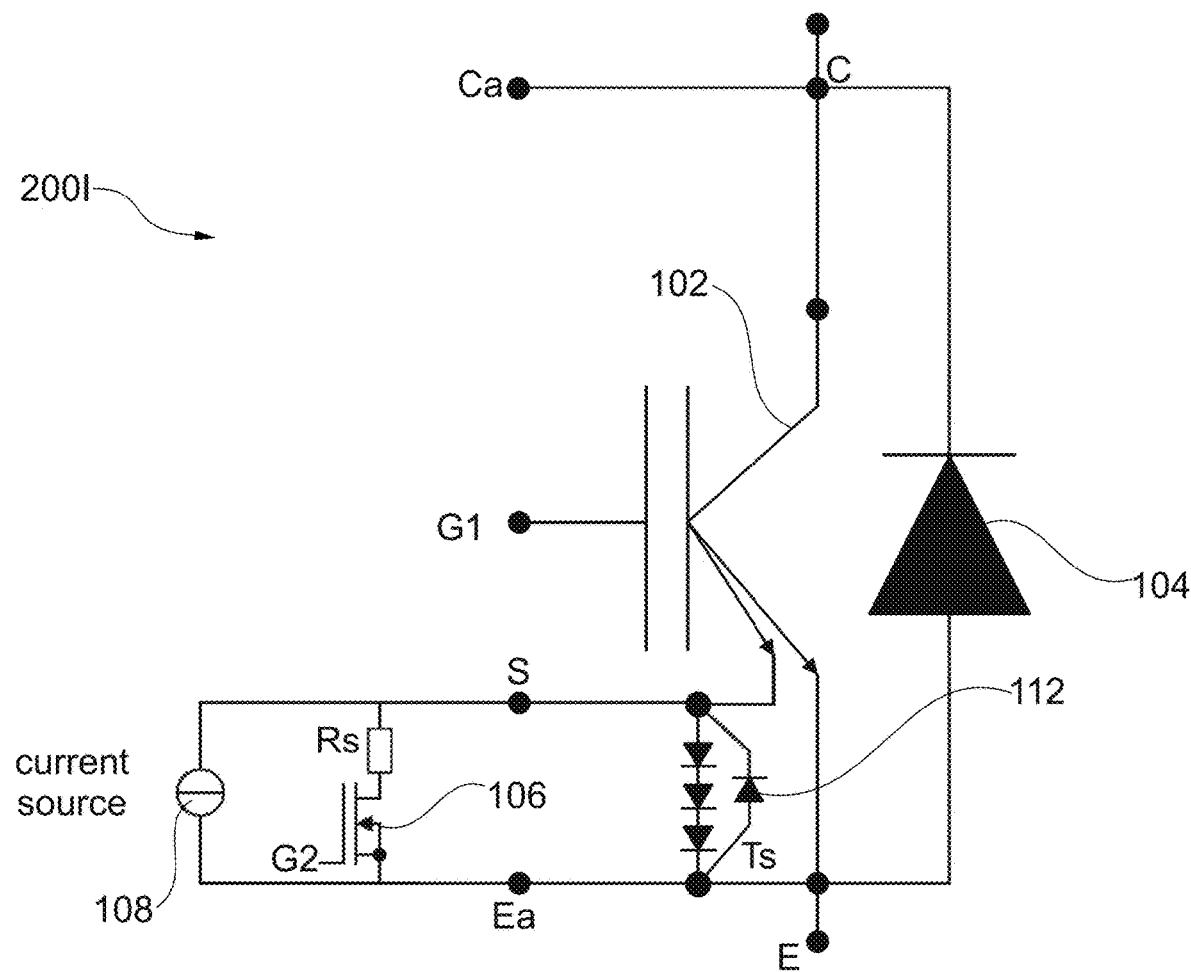
FIG. 7 is a schematic diagram of the power switch shown in FIG. 2A further including additional circuitry used for a test mode of operation.

FIG. 7 shows an integrated circuit 200I that is suitable for use in a self-test mode that is further described in greater detail below. Circuit 200I is the same as was previously described with integrated circuit 200E of FIG. 4, except that the gate G1 of IGBT 102 is separately and independently operable from the gate G2 of transistor 106.

When the gate G1 is off and gate G2 is on, a self-test of the temperature sensing circuit Ts can be active using current source 108. Due to a known defined current for current source 108, it is possible to check the sense resistor value Rs as well as the function of the additional transistor 106. In a case where the current source 108 has a malfunction, this can also be detected. The sense resistor Rs and current source 108 can thus be periodically tested as desired during the functional life of the IGBT or power switch circuit.

Figure 8:
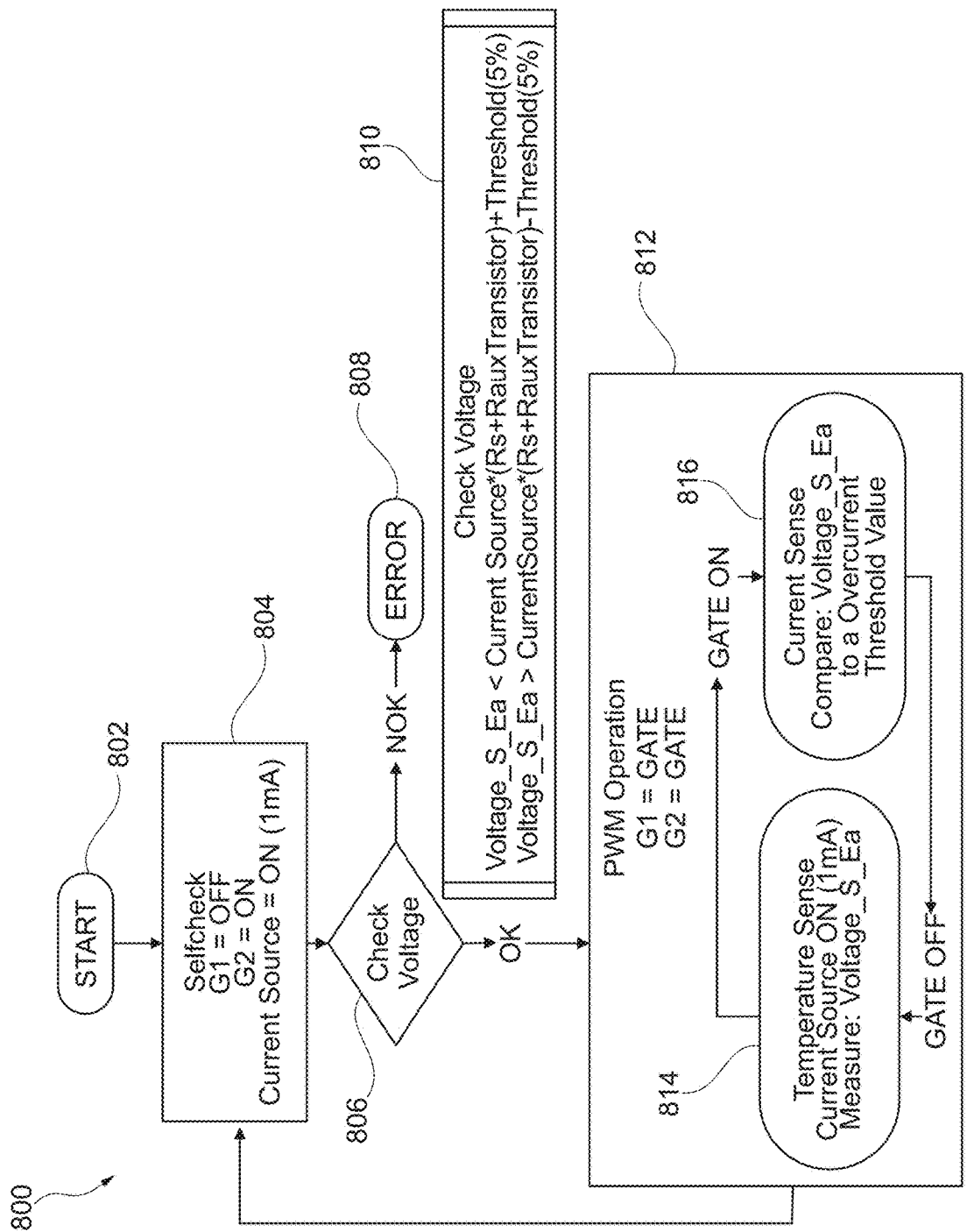
FIG. 8 is a flow chart for self-check and Pulse Width Modulation ("PWM") modes of operation for the power switch embodiments of FIGS. 2A and 7.

A flow chart 800 shown in FIG. 8 sets forth a method of operating a circuit including an on-chip temperature sensing circuit according to embodiments including a self-test or self-check mode in addition to a normal PWM operating mode. In the self-check mode, gate G1 and gate G2 are controlled individually. The individual control enables turning off IGBT 102 and checking with the current source 108 the current sense resistor Rs connection as well as the function of the current source 108. In normal PWM operation, gate G1 and gate G2 are controlled with same signal.

In flow chart 800, the method of operating the circuit including an on-chip temperature sensing circuit starts at step 802. A self-check is entered into first at self-check mode step 804. In self-check mode step 804, gate G1 is off, gate G2 is on, and current source is on with a nominal value of one milli-amp. The nominal value of one milli-amp is given as an example only and another nominal value of current source could be used. At check voltage step 806, the voltage Voltage_S_Ea between the sense emitter node S and the auxiliary emitter node Ea (or emitter node E if an auxiliary emitter node is not used) is checked. If the voltage is not within an expected voltage range 810, then an error flag is raised at step 808. In a production mode, the tested IGBT circuit can be determined to be faulty and reworked or scrapped. In an application mode, the IGBT circuit can be shut down by the surrounding operating system. If the voltage is within an expected voltage range 810, the method proceeds to a PWM operation mode at step 812.

An example expected voltage range 810, which is used at check voltage step 806, is given by the following equations:

$$\text{Voltage\_S\_Ea} < \text{CurrentSource} * (Rs + \text{RauxTransistor}) + \text{Threshold}(5\%) \text{ and}$$

$$\text{Voltage\_S\_Ea} > \text{CurrentSource} * (Rs + \text{RauxTransistor}) - \text{Threshold}(5\%),$$

wherein Voltage_S_Ea was previously defined, CurrentSource is the current value of current source 108, Rs is the resistance value of the sense resistor Rs, RauxTransistor is the series resistance value of transistor 106, and Threshold (5%) is a threshold voltage value that is five percent (as an example only) of an expected voltage value of Voltage_S_Ea.

At step 812, normal PWM operation is started. In normal PWM operation, gate G1 and gate G2 are coupled together to a common gate voltage, either ON or OFF. If the gates G1 and G2 are both off, a temperature sensing is performed at step 814, and, if the gates G1 and G2 are both on, then a current sensing is performed at step 816.

In the temperature sensing mode at step 814, current source 108 has a nominal value of one milli-amp and the voltage Voltage_S_Ea is measured. The measured voltage Voltage_S_Ea is converted to a temperature reading as previously discussed.

In the current sensing mode at step 816, the voltage Voltage_S_Ea is measured. The measured voltage Voltage_S_Ea is compared to an overcurrent threshold value. If the comparison is normal, the PWM mode continues normally. If the comparison indicates an overcurrent condition, then the IGBT circuit can be turned off or a warning signal can be generated, or other actions can be taken to minimize power dissipation and thus damage to the IGBT.

The interaction of the current sensing modes and the temperature sensing modes during normal PWM operation is further explained with reference to the timing diagram 900 of FIG. 9. Temperature sensing and current sensing are synchronous with the control pattern of the PWM signal. The temperature signal is sampled during the PWM off phases, and ideally center aligned in the PWM signal in middle of the off phase.

At counter zero, the power switch is in the middle of a freewheeling phase and ideally the temperature signal is sampled during this phase. During the normal PWM mode, the current sensing circuit is activated with a continuous comparing of the measured current signal to a fault threshold during entire turn-on mode. In the case of a current signal being recorded, it will be done at the maximum counter value. Temperature sensing is done at the minimum counter value in the center of freewheeling mode. The temperature signal is typically sampled with Analog-to-Digital ("ADC") circuits (not shown). The sampling is preferably triggered a short time after the gate is turned-off after switching transients and noise disappears or alternatively in the center aligned PWM at middle of the freewheeling phase (i.e. at PWM counter zero).

Figure 9:
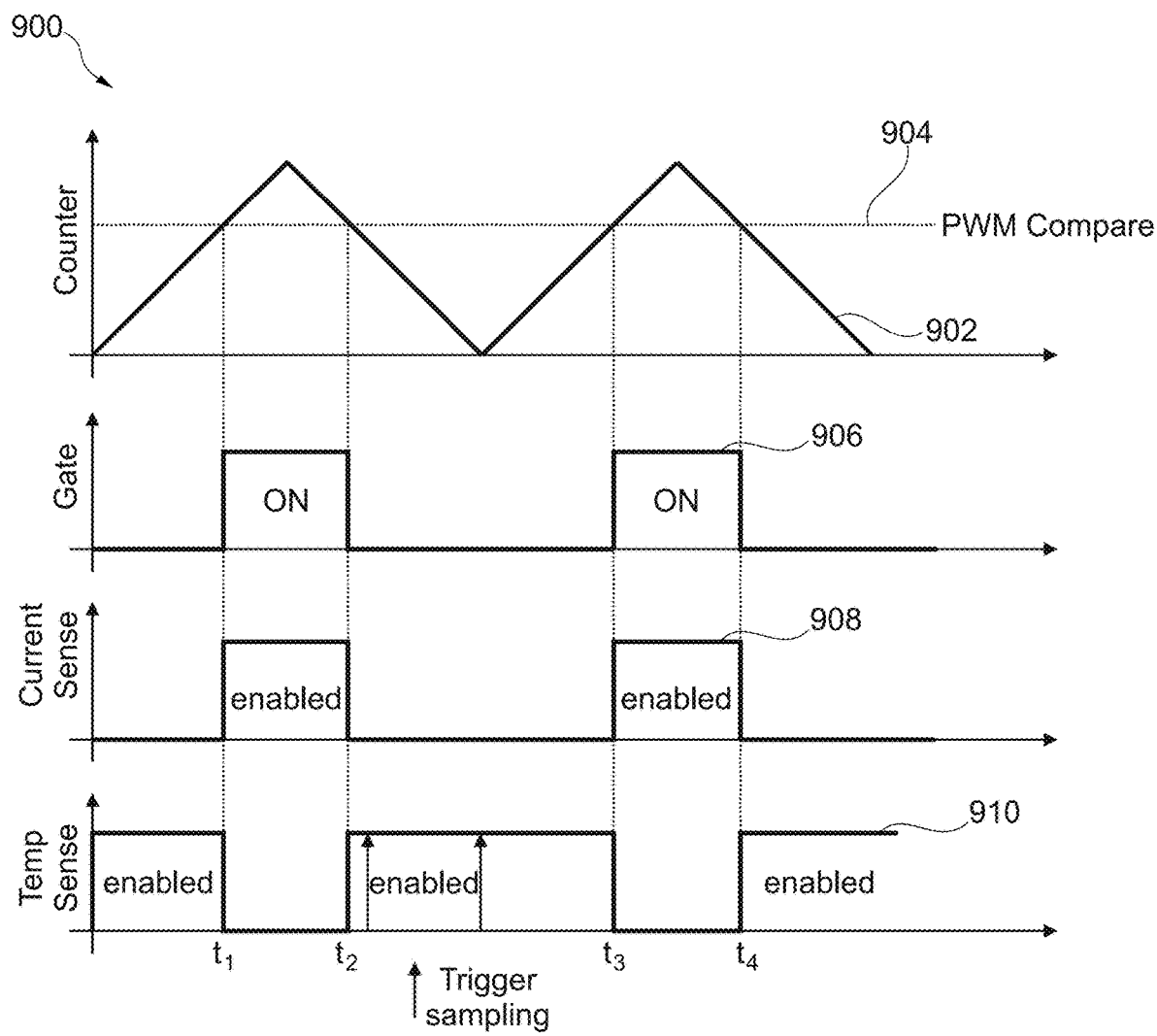
FIG. 9 is a timing diagram showing the relative times at which a current sensing mode and a temperature sensing mode are performed relative to a PWM input waveform.

Thus, the timing diagram 900 of FIG. 9 shows a PWM counter signal alternating between a zero count value and a maximum count value. The combined gates G1 and G2 are ON if the counter value 902 is above a PWM comparison threshold 904, otherwise the gates G1 and G2 are OFF as is shown by gate timing signal 906. When the gates are ON between times t1 and t2, and t3 and t4, the current sensing is enabled as is shown by current sense signal 908. When the gates are OFF between times t2 and t3, the temperature sensing is enabled as is shown by temperature sense signal 910. Triggering of the temperature sensing occurs either a short time after t2 or at the center of the OFF mode at the minimum count value (at a time of (t3−t2)/2)).

In summary, a power semiconductor (which can be a MOSFET, IGBT, Gate Turn-Off thyristor ("GTO"), or other type of power device) with an on-chip current and temperature sensor internally coupled ("internal" and "internally" being defined as coupling inside of the integrated circuit and not with a device or devices and corresponding connections that are external to the integrated circuit) between the sense emitter node S and the auxiliary emitter node Ea or emitter node E has been described. The on-chip current sensor can be implemented as providing a current mirror function with a split emitter arrangement as described or with separate pn-diode structures if desired. The temperature sensor is implemented with anti-parallel diodes that are connected between the current sensor (sense emitter) and the load pad (emitter). Due to this internal connection the ESD and Electrostatic OverStress ("EOS") robustness is improved. Furthermore, the number of signal pads is minimized leading to higher utilization of active integrated circuit area.

In an embodiment, an integrated circuit comprises a power switch comprising a current path and a current sense node; and a temperature sense circuit internally coupled between the current path and the current sense node of the power switch. The current path comprises a drain node and a first source node, and the current sense node comprises a second source node in an embodiment. The current path comprises a collector node and an emitter node, and the current sense node comprises a sense emitter node in an embodiment. The temperature sense circuit comprises a plurality of serial-connected diodes and an additional diode coupled in anti-parallel with the plurality of serial-connected diodes in an embodiment. The circuit further comprises a current sense resistor and an additional switch coupled between the current sense node and the current path, wherein the power switch further comprises a first control node and the additional switch comprises a second control node coupled to the first control node of the power switch in an embodiment. The temperature sense circuit is configured to be operated in a first mode of operation, wherein the first mode of operation comprises a free-wheeling mode in an embodiment. The circuit is configured to be operated as a current sensing circuit in a second mode of operation, wherein the second mode of operation comprises an on-state of the power switch in an embodiment.

In another embodiment, an integrated circuit comprises a power switch comprising a first current node, a second current node, and a third current node; and a temperature sense circuit coupled between the second current node and the third current node of the power switch, wherein the first current node comprises a power connection on a bottom surface of the integrated circuit, the second current node comprises a plurality of power connection stripes on a top surface of the integrated circuit, and the third current node comprises a first bonding pad on the top surface of the integrated circuit. The power switch further comprises a control node comprising a second bonding pad on the top surface of the integrated circuit in an embodiment. The temperature sense circuit is configured to be operated in a free-wheeling mode of operation in an embodiment. The circuit is configured to be operated as a current sensing circuit in an on-state of the power switch in an embodiment. The first current node comprises a collector node, the second current node comprises an emitter node, and the third current node comprises a sense emitter node in an embodiment. The first current node comprises a drain node, the second current node comprises a first source node, and the third current node comprises a second source node. The temperature sense circuit comprises a plurality of serial-connected diodes and an additional diode coupled in anti-parallel with the plurality of serial-connected diodes in an embodiment.

In another embodiment, a method comprises configuring a power switch to include a current path and a current sense node; and internal to the power switch, coupling a temperature sense circuit between the current path and the current sense node of the power switch. The method includes determining a temperature of the temperature sense circuit in a first mode of operation, and determining a current flowing in the current sense node in a second mode of operation, according to embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
a power switch comprising a current path and a current sense node; and
a temperature sense circuit internally coupled between the current path and the current sense node of the power switch; and
a current sense resistor and an additional switch coupled between the current sense node and the current path,
wherein the current path comprises a collector node and an emitter node, and the current sense node comprises a sense emitter node, and wherein the temperature sense circuit comprises a plurality of serial-connected diodes directly coupled to the power switch only between the sense emitter node and the emitter node.

2. The integrated circuit of claim 1, wherein the current path comprises a drain node and a first source node, and the current sense node comprises a second source node.

3. The integrated circuit of claim 1, further comprising an additional diode coupled in anti-parallel with the plurality of serial-connected diodes.

4. The integrated circuit of claim 1, wherein the power switch further comprises a first control node and the additional switch comprises a second control node coupled to the first control node of the power switch.

5. The integrated circuit of claim 1, wherein the temperature sense circuit is configured to be operated in a first mode of operation.

6. The integrated circuit of claim 5, wherein the first mode of operation comprises a free-wheeling mode.

7. The integrated circuit of claim 5, wherein the integrated circuit is configured to be operated as a current sensing circuit in a second mode of operation.

8. The integrated circuit of claim 7, wherein the second mode of operation comprises an on-state of the power switch.

9. A method comprising: configuring a power switch to include a current path and a current sense node; and internal to the power switch, coupling a temperature sense circuit between the current path and the current sense node of the power switch; and external to the power switch, coupling a current sense resistor and an additional switch between the current sense node and the current path, wherein the current path comprises a collector node and an emitter node, and the current sense node comprises a sense emitter node, and wherein the temperature sense circuit comprises a plurality of serial-connected diodes directly coupled to the power switch only between the sense emitter node and the emitter node.

10. The method of claim 9, further comprising determining a temperature of the temperature sense circuit in a first mode of operation.

11. The method of claim 10, further comprising determining a current flowing in the current sense node in a second mode of operation.

* * * * *